(12) United States Patent
Lin

(10) Patent No.: US 11,789,072 B2
(45) Date of Patent: Oct. 17, 2023

(54) CLOCK MONITOR CIRCUIT AND MICROCONTROLLER AND CONTROL METHOD THEREOF

(71) Applicant: Nuvoton Technology Corporation, Hsinchu (TW)

(72) Inventor: Wei-Ling Lin, Jhubei (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 17/947,641

(22) Filed: Sep. 19, 2022

(65) Prior Publication Data

US 2023/0152371 A1 May 18, 2023

(30) Foreign Application Priority Data

Nov. 18, 2021 (TW) .................................. 110142870

(51) Int. Cl.
*H03K 5/00* (2006.01)
*G01R 31/317* (2006.01)
*H03K 21/08* (2006.01)
*H03K 5/19* (2006.01)

(52) U.S. Cl.
CPC ......... *G01R 31/31727* (2013.01); *H03K 5/19* (2013.01); *H03K 21/08* (2013.01)

(58) Field of Classification Search
CPC ..... H03K 5/19; H03K 21/08; G01R 31/31727
See application file for complete search history.

(56) References Cited

U.S. PATENT DOCUMENTS

| 6,130,619 | A  | * | 10/2000 | Nakatani | ................. | H04L 1/246 370/216 |
| 6,343,096 | B1 | * | 1/2002  | Davidsson | ............... | H03K 5/19 375/371 |
| 6,354,366 | B1 | * | 3/2002  | Naiki | ................. | H05K 7/20209 417/42 |
| 8,937,496 | B1 | * | 1/2015  | Ahmad | .................... | H03K 5/19 327/39 |
| 10,848,140 | B1 | * | 11/2020 | Joshi | ........................ | H03K 5/19 |
| 2002/0008548 | A1 | * | 1/2002  | Kimura | ................. | H04L 7/0083 327/39 |
| 2002/0130695 | A1 | * | 9/2002  | Jesephson | ................. | G06F 1/04 327/291 |
| 2007/0262824 | A1 | * | 11/2007 | Yamasaki | ................ | H03K 5/19 331/74 |
| 2019/0198072 | A1 | * | 6/2019  | Park | ........................ | G06F 1/14 |

* cited by examiner

*Primary Examiner* — Tuan T Lam
(74) *Attorney, Agent, or Firm* — Muncy, Geissler, Olds & Lowe, P.C.

(57) ABSTRACT

A clock monitor circuit includes a monitor and a tunable counter. The monitor can monitor a clock under test. The tunable counter can count an integer according to a reference clock and set a target number. If a stable signal relative to the clock under test is toggled, the tunable counter can switch the target number from a large number to a small number. The tunable counter can perform an automatic detection process, so as to transmit a check signal to the monitor. In response to the check signal, if the clock under test is undetectable, the monitor will not transmit any confirmation signal back to the tunable counter, and the tunable counter will gradually increase the integer. When the integer is equal to the target number, the tunable counter generates a failure signal.

20 Claims, 5 Drawing Sheets

100

CLOCK MONITOR CIRCUIT AND MICROCONTROLLER AND CONTROL METHOD THEREOF

CROSS REFERENCE TO RELATED APPLICATIONS

This application claims priority of Taiwan Patent Application No. 110142870 filed on Nov. 18, 2021, the entirety of which is incorporated by reference herein.

BACKGROUND OF THE INVENTION

Field of the Invention

The disclosure generally relates to a clock monitor circuit, and more specifically, to a clock monitor circuit with a function of automatic detection.

Description of the Related Art

In a conventional microcontroller, a clock monitor circuit usually performs a relative detection process after a clock under test is stabilized. Furthermore, if the clock under test suddenly disappears, it will take a lot of time to find out that this abnormal event has even occurred, thereby degrading the overall reliability of the whole system. Accordingly, there is a need to propose a novel solution for solving the problems of the prior art.

BRIEF SUMMARY OF THE INVENTION

In an exemplary embodiment, the invention is directed to a clock monitor circuit that includes a monitor and a tunable counter. The monitor can monitor a clock under test. The tunable counter can count an integer according to a reference clock and set a target number. If a stable signal relative to the clock under test is toggled, the tunable counter can switch the target number from a large number to a small number. The tunable counter can perform an automatic detection process, so as to transmit a check signal to the monitor. In response to the check signal, if the clock under test is undetectable, the monitor will not transmit any confirmation signal back to the tunable counter, and the tunable counter will gradually increase the integer. When the integer is equal to the target number, the tunable counter generates a failure signal.

In some embodiments, in response to the check signal, if the clock under test is detectable, the monitor will transmit a confirmation signal back to the tunable counter, so as to reset the integer of the tunable counter.

In some embodiments, the stable signal is initially kept at a low logic level. After a predetermined time, the stable signal rises up to a high logic level.

In some embodiments, the first number is equal to 100.

In some embodiments, the second number is equal to 2.

In some embodiments, the stable signal has a low logic level within a first stage. The stable signal has a high logic level within a second stage.

In some embodiments, the tunable counter performs the automatic detection process during both of the first stage and the second stage.

In some embodiments, the clock monitor circuit further includes a resetter. When the failure signal is generated, the resetter transmits a recovery signal to the tunable counter, so as to pull the failure signal from a high logic level back to a low logic level.

In another exemplary embodiment, the invention is directed to a control method that includes the steps of: monitoring a clock under test via a monitor; counting an integer according to a reference clock and setting a target number via a tunable counter; if a stable signal relative to the clock under test is toggled, switching the target number from a first number to a second number, wherein the first number is greater than the second number; performing an automatic detection process, so as to transmit a check signal to the monitor; in response to the check signal, if the clock under test is undetectable, not transmitting any confirmation signal back to the tunable counter, and gradually increasing the integer of the tunable counter; and when the integer is equal to the target number, generating a failure signal.

In some embodiments, the control method further includes: in response to the check signal, if the clock under test is detectable, transmitting a confirmation signal back to the tunable counter, so as to reset the integer of the tunable counter.

In some embodiments, the control method further includes: when the failure signal is generated, transmitting a recovery signal to the tunable counter, so as to pull the failure signal from a high logic level back to a low logic level.

In another exemplary embodiment, the invention is directed to a microcontroller that includes a monitor and a tunable counter. The monitor can monitor a clock under test. The tunable counter can count an integer according to a reference clock and set a target number. If a stable signal relative to the clock under test is toggled, the tunable counter can switch the target number from a large number to a small number. The tunable counter can perform an automatic detection process, so as to transmit a check signal to the monitor. In response to the check signal, if the clock under test is undetectable, the monitor will not transmit any confirmation signal back to the tunable counter, and the tunable counter will gradually increase the integer. When the integer is equal to the target number, the tunable counter generates a failure signal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail below.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
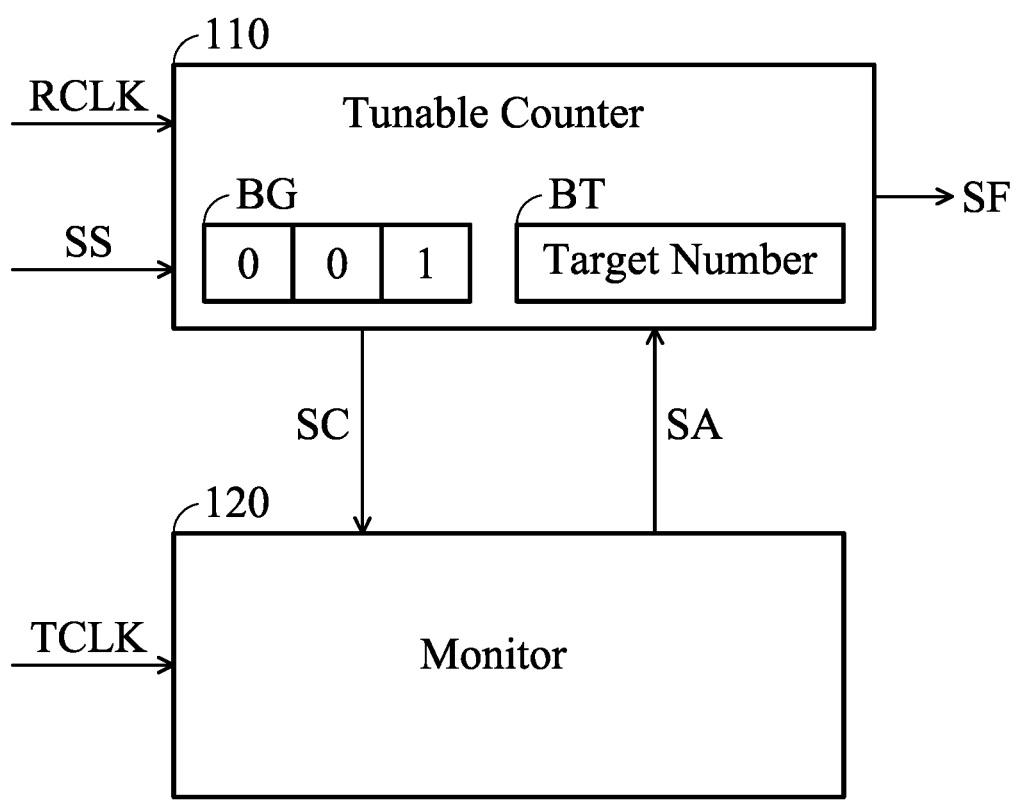
FIG. 1 is a diagram of a clock monitor circuit according to an embodiment of the invention.

FIG. 1 is a diagram of a clock monitor circuit 100 according to an embodiment of the invention. The clock monitor circuit 100 is applied to a microcontroller, but it is not limited thereto. As shown in FIG. 1, the clock monitor circuit 100 at least includes a tunable counter 110 and a monitor 120, which may be implemented with ICs (Integrated Circuits). In alternative embodiments, the clock monitor circuit 100 is replaced with a microcontroller 100.

The tunable counter 110 can count an integer BG according to a reference clock RCLK, and can set a target number BT. For example, the integer BG may be initially set to 0, and may be selectively increased according to the reference clock RCLK, but it is not limited thereto. The target number BT may be any integer which is greater than or equal to 2. In addition, the monitor 120 can monitor a clock under test TCLK. In some embodiments, the reference clock RCLK and the clock under test TCLK have the same frequency and the same phase. In alternative embodiments, the reference clock RCLK and the clock under test TCLK have different frequencies and different phases.

Figure 2:
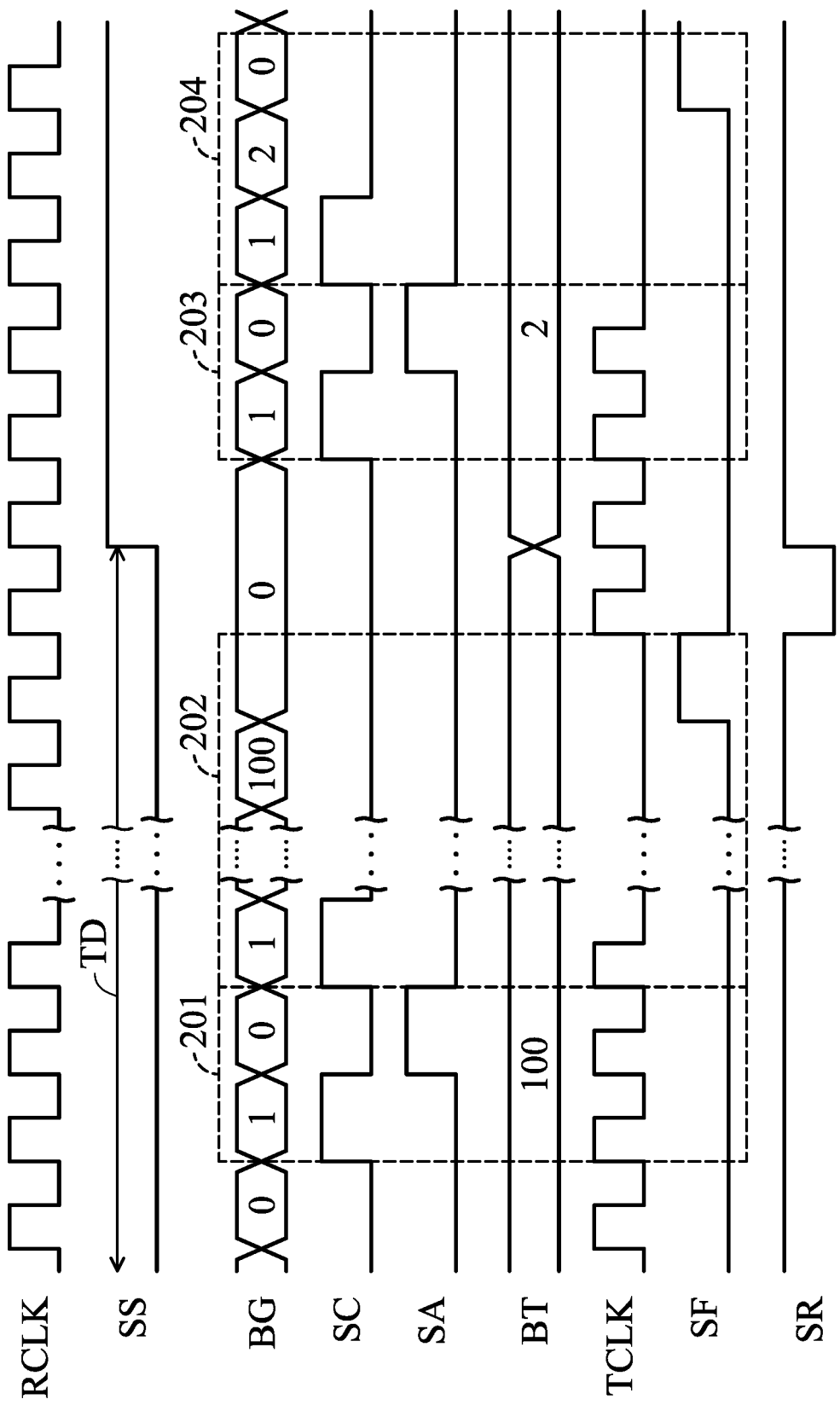
FIG. 2 is a diagram of signal waveforms of a clock monitor circuit according to an embodiment of the invention.

FIG. 2 is a diagram of signal waveforms of the clock monitor circuit 100 according to an embodiment of the invention. Please refer to FIG. 1 and FIG. 2 together to understand the invention. The tunable counter 110 can further receive a stable signal SS relative to the clock under test TCLK. In some embodiments, the stable signal SS is initially kept at a low logic level (i.e., a logic "0"), and after a predetermined time TD, the stable signal SS rises up to a high logic level (i.e., a logic "1"). According to the switching operation of the stable signal SS, the clock monitor circuit 100 operates in either a first stage or a second stage. That is, within the first stage, the stable signal SS has a low logic level, so as to indicate that the clock under test TCLK has not been in a stable stage. Within the second stage, the stable signal SS has a high logic level, so as to indicate that the clock under test TCLK has been in the stable stage. It should be noted that if the stable signal SS is toggled (e.g., rising up from a low logic level to a high logic level), the tunable counter 110 will switch the target number BT from a large number (i.e., a first number) to a small number (i.e., a second number). In some embodiments, the large number is equal to 100, and the small number is equal to 2, but they are adjustable according to different requirements. Conversely, if the stable signal SS is not toggled (e.g., kept at a low logic level), the tunable counter 110 will not change the target number BT (e.g., maintained at the large number).

The tunable counter 110 can perform an automatic detection process, so as to transmit a check signal SC to the monitor 120. In response to the check signal SC, if the clock under test TCLK is detectable by the monitor 120, the monitor 120 will transmit a confirmation signal SA back to the tunable counter 110, so as to reset the integer BG of the tunable counter 110 to an initial value (e.g., 0), as indicated by the first dashed box 201. Each of the check signal SC and the confirmation signal SA may be a high logic pulse. The aforementioned automatic detection process may be performed periodically. For example, after the confirmation signal SA is received, the tunable counter 110 may transmit the check signal SC to the monitor 120 again.

On the other hand, in response to the check signal SC, if the clock under test TCLK is undetectable by the monitor 120 (or the clock under test TCLK is continuously kept at a low logic level), the monitor 120 will not transmit any confirmation signal SA back to the tunable counter 110. Since no confirmation signal SA is received, the tunable counter 110 cannot be reset, and it can gradually increase the integer BG according to the reference clock RCLK. For example, at each rising edge of the reference clock RCLK, the integer BG of the tunable counter 110 may be increased by 1, but it is not limited thereto. When the integer BG of the tunable counter 110 is exactly equal to the target number BT (or the large number, such as 100), the tunable counter 110 can generate a failure signal SF, so as to indicate that the clock under test TCLK is in an abnormal state, as indicated by the second dashed box 202. For example, the failure signal SF may be a high logic pulse. In some embodiments, the tunable counter 110 can reset the integer BG to its initial value when the failure signal SF is generated.

In the above embodiments, the tunable counter 110 performs the automatic detection process during first stage. It should be understood that the tunable counter 110 also can perform the automatic detection process during second stage. After the stable signal SS is toggled, as shown by a third dashed box 203, the tunable counter 110 can perform the automatic detection process, so as to transmit the check signal SC to the monitor 120. In response to the check signal SC, if the clock under test TCLK is detectable by the monitor 120, the monitor 120 can transmit the confirmation signal SA back to the tunable counter 110, so as to reset the integer BG of the tunable counter 110 to its initial value.

As shown in a fourth dashed box 204, in response to the check signal SC, if the clock under test TCLK is undetectable by the monitor 120 (or the clock under test TCLK is continuously kept at a low logic level), the monitor 120 will not transmit any confirmation signal SA back to the tunable counter 110. Since no confirmation signal SA is received, the tunable counter 110 cannot be reset, and it can gradually increase the integer BG according to the reference clock RCLK. When the integer BG of the tunable counter 110 is exactly equal to the target number BT (or the small number, such as 2), the tunable counter 110 can generate the failure signal SF.

When the clock under test TCLK has not entered the stable state (i.e., during the first stage), the relatively large target number BT can avoid the misjudgment of whole system entering the power-saving mode. On the contrary, when the clock under test TCLK has entered the stable state (i.e., during the second stage), the relatively small target number BT can avoid too long a preset time of generation of the failure signal SF. Therefore, the switchable target number BT can significantly improve the efficiency and reliability of the clock monitor circuit 100.

Figure 3:
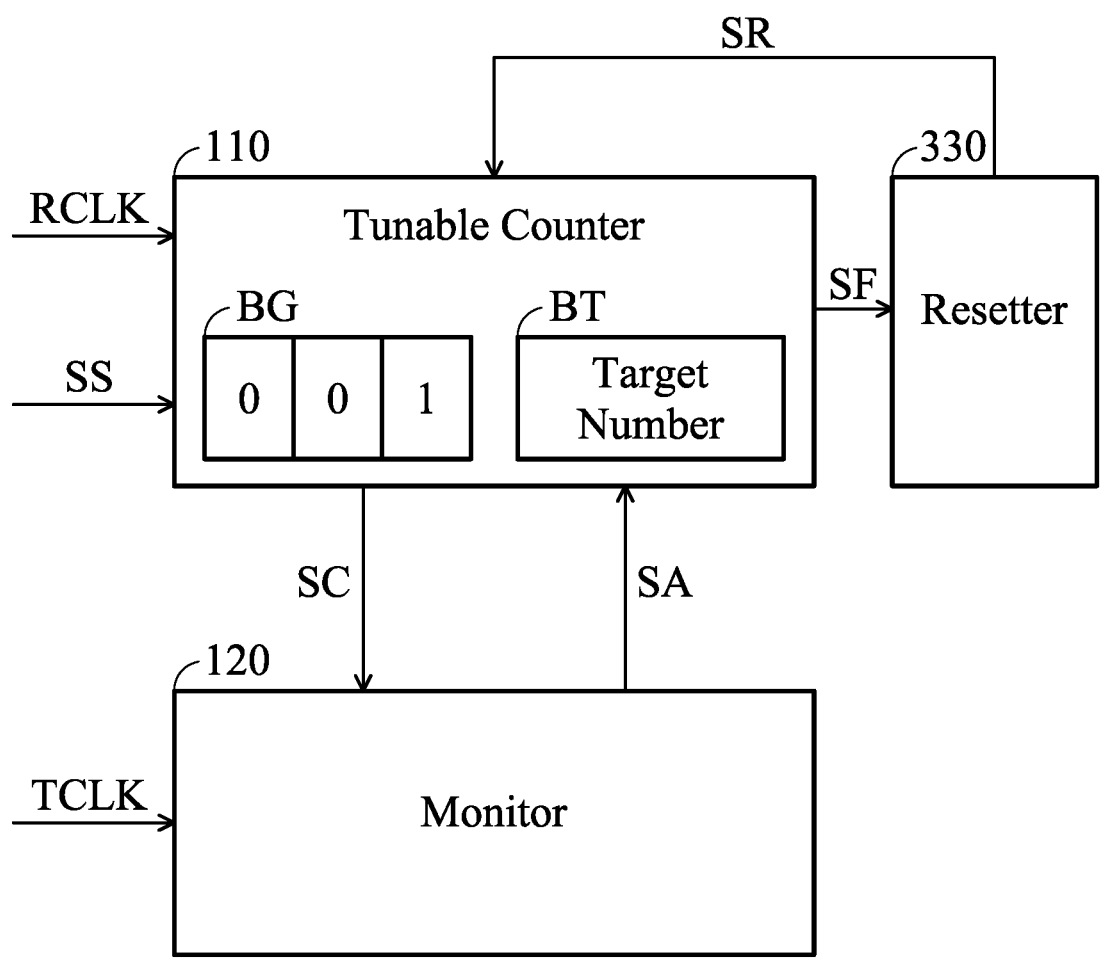
FIG. 3 is a diagram of a clock monitor circuit according to another embodiment of the invention.

FIG. 3 is a diagram of a clock monitor circuit 300 according to another embodiment of the invention. FIG. 3 is similar to FIG. 1. In the embodiment of FIG. 3, the clock monitor circuit 300 further includes a resetter 330. Please refer to FIG. 2 and FIG. 3 together. When the failure signal SF is generated, the resetter 330 can transmit a recovery signal SR to the tunable counter 110, so as to pull the failure signal SF from a high logic level back to a low logic level. For example, the recovery signal SR may be a low logic pulse. It should be understood that the resetter 330 is an optional component, which is omitted in other embodiments. Other features of the clock monitor circuit 300 of FIG. 3 are similar to those of the clock monitor circuit 100 of FIG. 1. Thus, the two embodiments can achieve similar levels of performance.

Figure 4A:
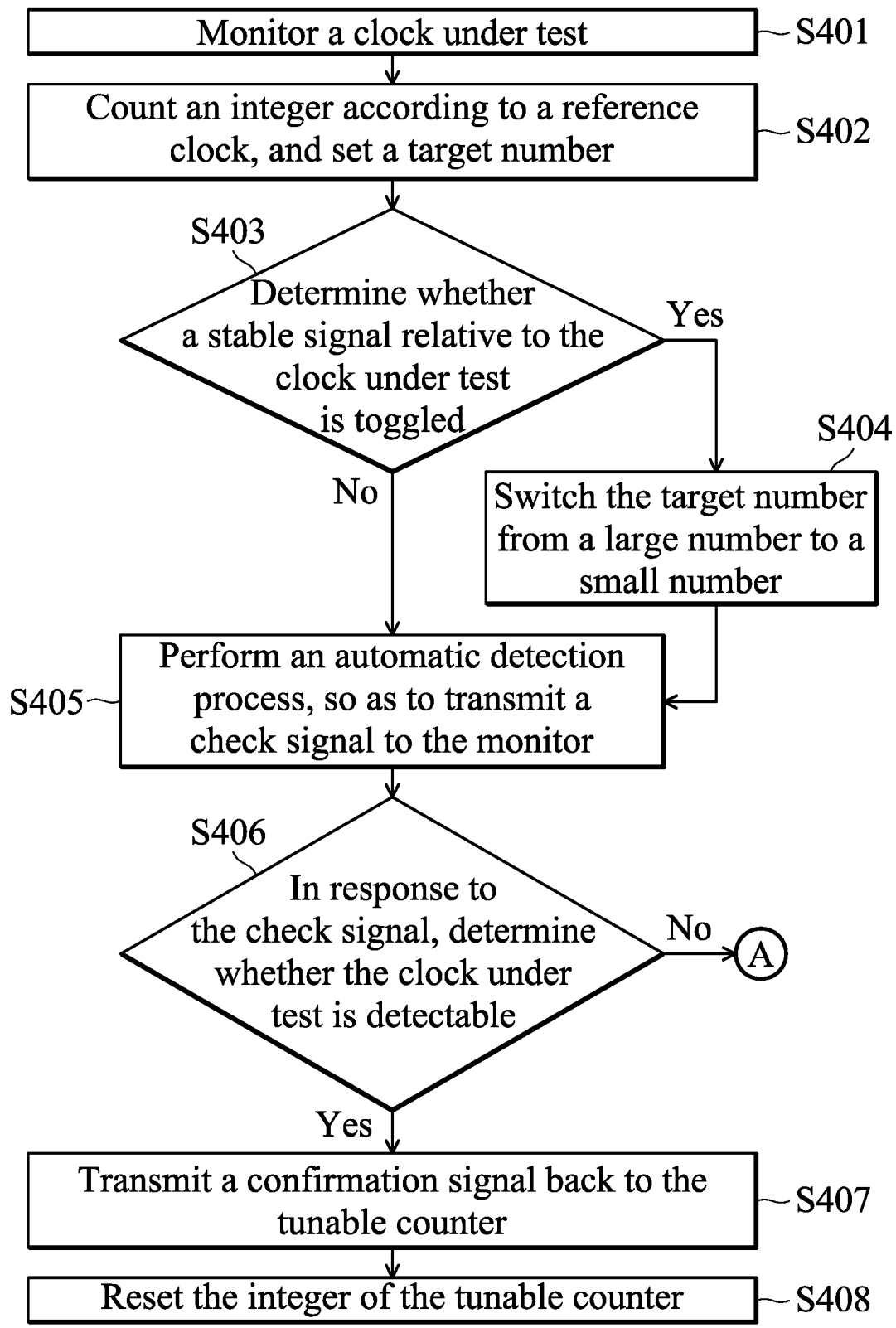
FIG. 4A and FIG. 4B are a flowchart of a control method according to an embodiment of the invention.
Figure 4B:
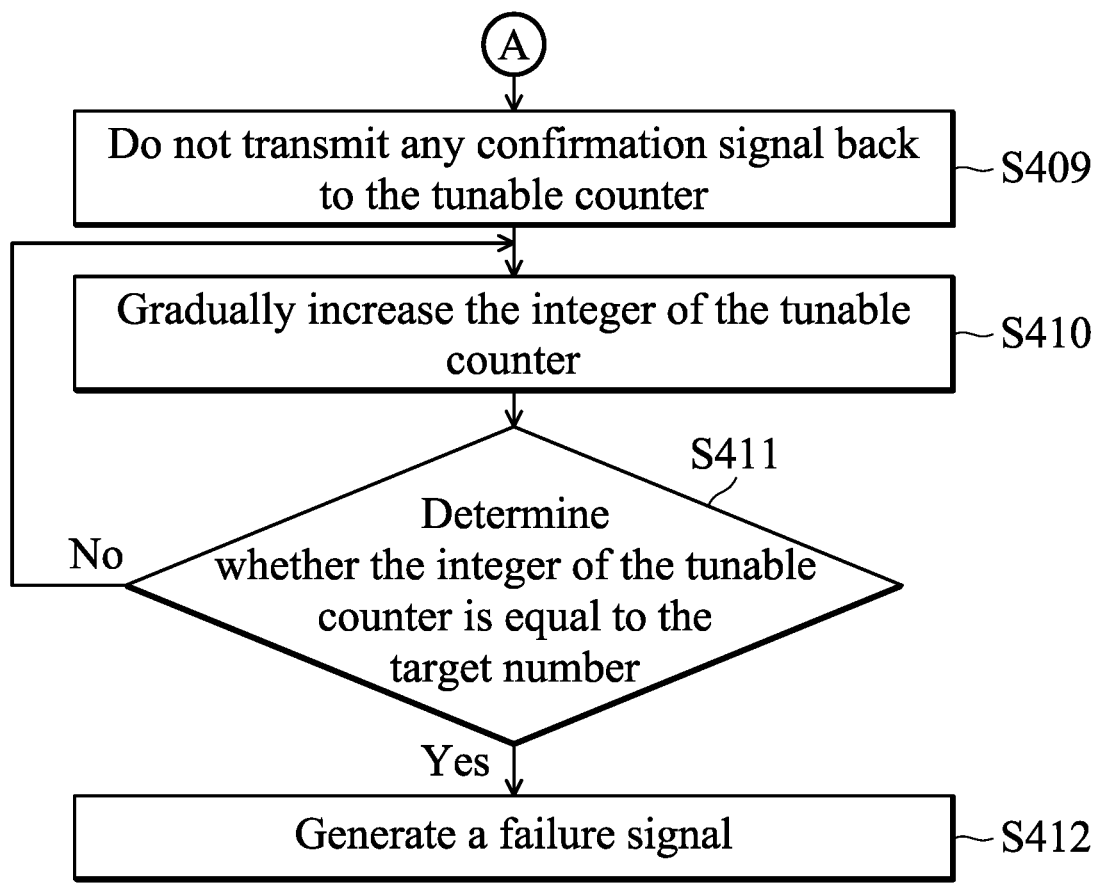

FIG. 4A and FIG. 4B are a flowchart of a control method according to an embodiment of the invention. Initially, in step S401, a clock under test is monitored by a monitor. In step S402, an integer is counted according to a reference clock and a target number is set by a tunable counter. In step S403, whether a stable signal relative to the clock under test is toggled is determined. If so, in step S404, the target number will be switched from a large number to a small number, and then step S405 will be performed. If not, the target number will be kept unchanged, and then step S405 will be directly performed. In step S405, an automatic detection process is performed, so as to transmit a check signal to the monitor. In step S406, in response to the check signal, whether the clock under test is detectable is determined. If the clock under test is detectable, in step S407, a confirmation signal will be transmitted back to the tunable counter. Next, in step S408, the integer of the tunable counter is reset. If the clock under test is undetectable, in step S409, no confirmation signal will be transmitted back to the tunable counter. Next, in step S410, the integer of the tunable counter is gradually increased. In step S411, whether the integer of the tunable counter is exactly equal to the target number is determined. If not, the procedure will go back to step S410. If so, in step S412, a failure signal will be generated by the tunable counter. It should be understood that the above steps are not required to be performed in order, and every feature in the embodiments of FIGS. 1 to 3 may be applied to the control method of FIG. 4A and FIG. 4B.

The invention proposes a novel clock monitor circuit, a novel microcontroller, and a novel control method. With such a design of the invention, no matter whether the clock under test enters a stable state, it can be automatically detected by a tunable counter and a monitor. Furthermore, since the target number of the tunable counter is switchable according to a stable signal, the reliability of the whole system can be effectively improved. In comparison to the conventional design, the invention has at least the advantages of low complexity and high efficiency, and therefore it is suitable for application in a variety of electronic devices.

Note that the above element parameters are not limitations of the invention. A designer can fine-tune these settings or values according to different requirements. It should be understood that the clock monitor circuit, the microcontroller, and the control method of the invention are not limited to the configurations of FIGS. 1-4. The invention may merely include any one or more features of any one or more embodiments of FIGS. 1-4. In other words, not all of the features displayed in the figures should be implemented in the clock monitor circuit, the microcontroller, and the control method of the invention.

The method of the invention, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine, such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine, such as a computer, the machine becomes an apparatus for practicing the disclosed methods. When implemented on a general-purpose processor, the program code combines with the processor to provide a unique apparatus that operates analogously to application specific logic circuits.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock monitor circuit, comprising:
   a monitor, monitoring a clock under test; and
   a tunable counter, counting an integer according to a reference clock, and setting a target number;
   wherein if a stable signal relative to the clock under test is toggled, the tunable counter switches the target number from a first number to a second number, and the first number is greater than the second number;
   wherein the tunable counter performs an automatic detection process, so as to transmit a check signal to the monitor;
   in response to the check signal, if the clock under test is undetectable, the monitor does not transmit any confirmation signal back to the tunable counter, and the tunable counter gradually increases the integer;
   wherein when the integer is equal to the target number, the tunable counter generates a failure signal.

2. The clock monitor circuit as claimed in claim 1, wherein in response to the check signal, if the clock under test is detectable, the monitor transmits a confirmation signal back to the tunable counter, so as to reset the integer of the tunable counter.

3. The clock monitor circuit as claimed in claim 1, wherein the stable signal is initially kept at a low logic level, and wherein the stable signal rises up to a high logic level after a predetermined time.

4. The clock monitor circuit as claimed in claim 1, wherein the first number is equal to 100.

5. The clock monitor circuit as claimed in claim 1, wherein the second number is equal to 2.

6. The clock monitor circuit as claimed in claim 1, wherein the stable signal has a low logic level within a first stage, and wherein the stable signal has a high logic level within a second stage.

7. The clock monitor circuit as claimed in claim 6, wherein the tunable counter performs the automatic detection process during both of the first stage and the second stage.

8. The clock monitor circuit as claimed in claim 1, further comprising:
   a resetter, wherein when the failure signal is generated, the resetter transmits a recovery signal to the tunable counter, so as to pull the failure signal from a high logic level back to a low logic level.

9. A control method, comprising the steps of:
monitoring a clock under test via a monitor;
counting an integer according to a reference clock and setting a target number via a tunable counter;
if a stable signal relative to the clock under test is toggled, switching the target number from a first number to a second number, wherein the first number is greater than the second number;
performing an automatic detection process, so as to transmit a check signal to the monitor;
in response to the check signal, if the clock under test is undetectable, not transmitting any confirmation signal back to the tunable counter, and gradually increasing the integer of the tunable counter; and
when the integer is equal to the target number, generating a failure signal.

10. The control method as claimed in claim 9, further comprising:
in response to the check signal, if the clock under test is detectable, transmitting a confirmation signal back to the tunable counter, so as to reset the integer of the tunable counter.

11. The control method as claimed in claim 9, wherein the stable signal is initially kept at a low logic level, and wherein the stable signal rises up to a high logic level after a predetermined time.

12. The control method as claimed in claim 9, wherein the first number is equal to 100.

13. The control method as claimed in claim 9, wherein the second number is equal to 2.

14. The control method as claimed in claim 9, wherein the stable signal has a low logic level within a first stage, and wherein the stable signal has a high logic level within a second stage.

15. The control method as claimed in claim 14, wherein the tunable counter performs the automatic detection process during both of the first stage and the second stage.

16. The control method as claimed in claim 9, further comprising:
when the failure signal is generated, transmitting a recovery signal to the tunable counter, so as to pull the failure signal from a high logic level back to a low logic level.

17. A microcontroller, comprising:
a monitor, monitoring a clock under test; and
a tunable counter, counting an integer according to a reference clock, and setting a target number;
wherein if a stable signal relative to the clock under test is toggled, the tunable counter switches the target number from a first number to a second number, and the first number is greater than the second number;
wherein the tunable counter performs an automatic detection process, so as to transmit a check signal to the monitor;
in response to the check signal, if the clock under test is undetectable, the monitor does not transmit any confirmation signal back to the tunable counter, and the tunable counter gradually increases the integer;
wherein when the integer is equal to the target number, the tunable counter generates a failure signal.

18. The microcontroller as claimed in claim 17, wherein in response to the check signal, if the clock under test is detectable, the monitor transmits a confirmation signal back to the tunable counter, so as to reset the integer of the tunable counter.

19. The microcontroller as claimed in claim 17, wherein the stable signal has a low logic level within a first stage, and wherein the stable signal has a high logic level within a second stage.

20. The microcontroller as claimed in claim 19, wherein the tunable counter performs the automatic detection process during both of the first stage and the second stage.

* * * * *